United States Patent
Wu et al.

(10) Patent No.: US 6,456,211 B2
(45) Date of Patent: Sep. 24, 2002

(54) METHOD AND SYSTEM FOR CALIBRATING A DATA CONVERTER

(75) Inventors: Lin Wu, Ames, IA (US); Richard Knight Hester, McKinney, Collin County, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/757,106

(22) Filed: Jan. 8, 2001

Related U.S. Application Data (60) Provisional application No. 60/175,576, filed on Jan. 11, 2000.

(51) Int. Cl.$^7$ .................................................. H03M 1/10

(52) U.S. Cl. ...................................... 341/120; 341/155

(58) Field of Search ................................ 341/118, 119, 341/120, 155, 161

(56) References Cited

U.S. PATENT DOCUMENTS

| | | | | |
|---|---|---|---|---|
| 5,861,828 A | * | 1/1999 | Opris | 341/120 |
| 5,929,796 A | * | 7/1999 | Opris et al. | 341/120 |
| 6,097,326 A | * | 8/2000 | Opris et al. | 341/161 |

* cited by examiner

*Primary Examiner*—Peguy JeanPierre
*Assistant Examiner*—Jean Bruner Jeanglaude
(74) *Attorney, Agent, or Firm*—W. Daniel Swayze, Jr.; W. James Brady; Frederick J. Telecky, Jr.

(57) ABSTRACT

A system (100) for calibrating data converters (101) includes a data converter (101) that receives an input signal and generates one or more pre-digital error correction codes from the input signal. A calibrator (150) receives the pre-digital error correction codes, formulating one or more transition voltage expressions using the pre-digital error correction codes, and compares the transition voltage expressions to one or more measured transition voltage values to generate one or more calibrated values. More specifically, the data converter (101) may be a pipelined analog-to-digital converter (101).

18 Claims, 2 Drawing Sheets

METHOD AND SYSTEM FOR CALIBRATING A DATA CONVERTER

This application claims priority under 35 USC §119(e)(1) of provisional application number 60/175,576 filed Jan. 11, 2000.

TECHNICAL FIELD OF THE INVENTION

This invention relates generally to the field of electronic systems and more specifically to a method and system for calibrating data converters.

BACKGROUND OF THE INVENTION

The demand for high speed, high resolution analog-to-digital converters (ADCs) has led to the increasing importance of the effective calibration of pipelined ADCs. Pipelined architecture is widely used for high speed, high resolution ADCs because of its reasonable cost and low power dissipation. Circuit imperfections, however, limit the resolution of pipelined ADCs. Calibration is one of the most effective approaches for improving the resolution of high speed pipelined ADCs. Known methods and systems for calibrating pipelined ADCs, however, have not been able to achieve today's demand for high resolution.

Analog-to-digital conversion in pipelined ADCs is a multi-stage process. In the first stage, an analog input is sampled and held. The input is then converted into a digital code by a low resolution ADC (subADC) as a first approximation of the analog input. The digital code forms part of the output of the ADC, and is also converted back to an analog code by a low resolution digital-to-analog converter (subDAC). The analog code is subtracted from the analog input to yield a residue voltage. The residue voltage is amplified and sent to the second stage where this process is repeated, and so on. The digital code from the multiple stages is corrected for subADC errors and then output from the ADC.

ADC resolution is limited by two types of errors. The first type of error occurs when the residue exceeds the input range of a subsequent subADC. These errors are relatively easy to correct by using digital error correction, which reduces the gain to guarantee that the residue signal is within the range of the next subADC. The second type of error results from changes in the residue as it is propagated through an imperfect circuit from one stage to the next, and is typically corrected by calibration. These errors pose a major challenge for calibration, as it is difficult to estimate the error caused by residue changes.

Known calibration methods use the output of digital error correction to estimate the error of the ADC output. From the estimate, calibrated values are computed to correct the second type of error. One problem with these methods is that the digital error correction output does not contain information about the actual state of every stage of the pipelined process, resulting in poor error estimation and consequently poor error correction. For example, suppose there are three stages, and each stage has two-bit digital code segments, $D_1=01$, $D_2=10$, $D_3=01$, where the digital code may be written as (01,10,01). A digital error correction output may be constructed by adding the code segments with adjacent code segments overlapping by one bit:

```
      01    D1
      10    D2
  +)   01   D3
     ─────────
     1001  binary output
```

The digital error correction output is 1001. Note that code (10,00,01) also produces a digital error correction output of 1001. From the digital error correction output 1001, it is impossible to know the state of every ADC stage, for example, the first stage could be 01 or 10. Another problem with these methods is that the they cannot provide accurate error correction for the full range of the input voltages. These methods estimate error by performing a best fit procedure on one section of the input voltage at a time. After calibration, the individual sections may have minimized error, but the whole range might not. This is especially problematic in applications that require a large dynamic range.

While these approaches have provided improvements over prior approaches, the challenges in the field of electronic systems have continued to increase with demands for more and better techniques having greater accuracy. Therefore, a need has arisen for a new method and system for calibrating data converters.

SUMMARY OF THE INVENTION

In accordance with the present invention, a method and system for calibrating analog-to-digital converters are provided that substantially eliminate or reduce the disadvantages and problems associated with previously developed systems and methods.

According to one embodiment of the present invention, a system for calibrating data converters is disclosed that includes a data converter that receives an input signal and generates one or more pre-digital error correction codes from the input signal. A calibrator receives pre-digital error correction codes, formulates expressions of one or more transition voltages using the pre-digital error correction codes, and compares the transition voltage expressions to one or more measured transition voltage values to generate one or more calibrated values. More specifically, the data converter may be a pipelined analog-to-digital converter.

According to one embodiment of the present invention, a method for calibrating data converters is disclosed. First, an input signal is input into a data converter. Second, pre-digital error correction codes for the input signal are provided by the data converter. Third, transition voltages are measured to yield measured transition voltage values. Fourth, transition voltage expressions are formulated using the pre-digital error correction codes. Fifth, calibrated values are calculated by comparing the transition voltage expressions to the measured transition voltage values. Finally, the data converter is calibrated using the calibrated values.

A technical advantage of the present invention is that it uses pre-digital error correction codes, which directly reflect the behavior of every ADC stage, and therefore contain more error information. Consequently, the use of pre-digital error correction codes increase the accuracy of the calibration, thus improving the performance of ADCs. Another technical advantage of the present invention is that it determines the best fit for the full range of input voltages, resulting in a better approximation over the whole range, which is especially important for applications that require a large dynamic range. Another technical advantage of the present invention is that it not only corrects the errors resulting from when the residue exceeds the input range of a subsequent subADC but also corrects errors from changes in the residue as it is propagated through an imperfect circuit from one stage to the next. This eliminates the need for a separate digital error correction module. Another technical advantage of the present invention is that it poses no additional requirements on pipelined ADC design. The only requirement is that pre-digital error correction codes are accessible during the calibration mode. Other technical advantages are readily apparent to one of skill in the art.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Figure 1:
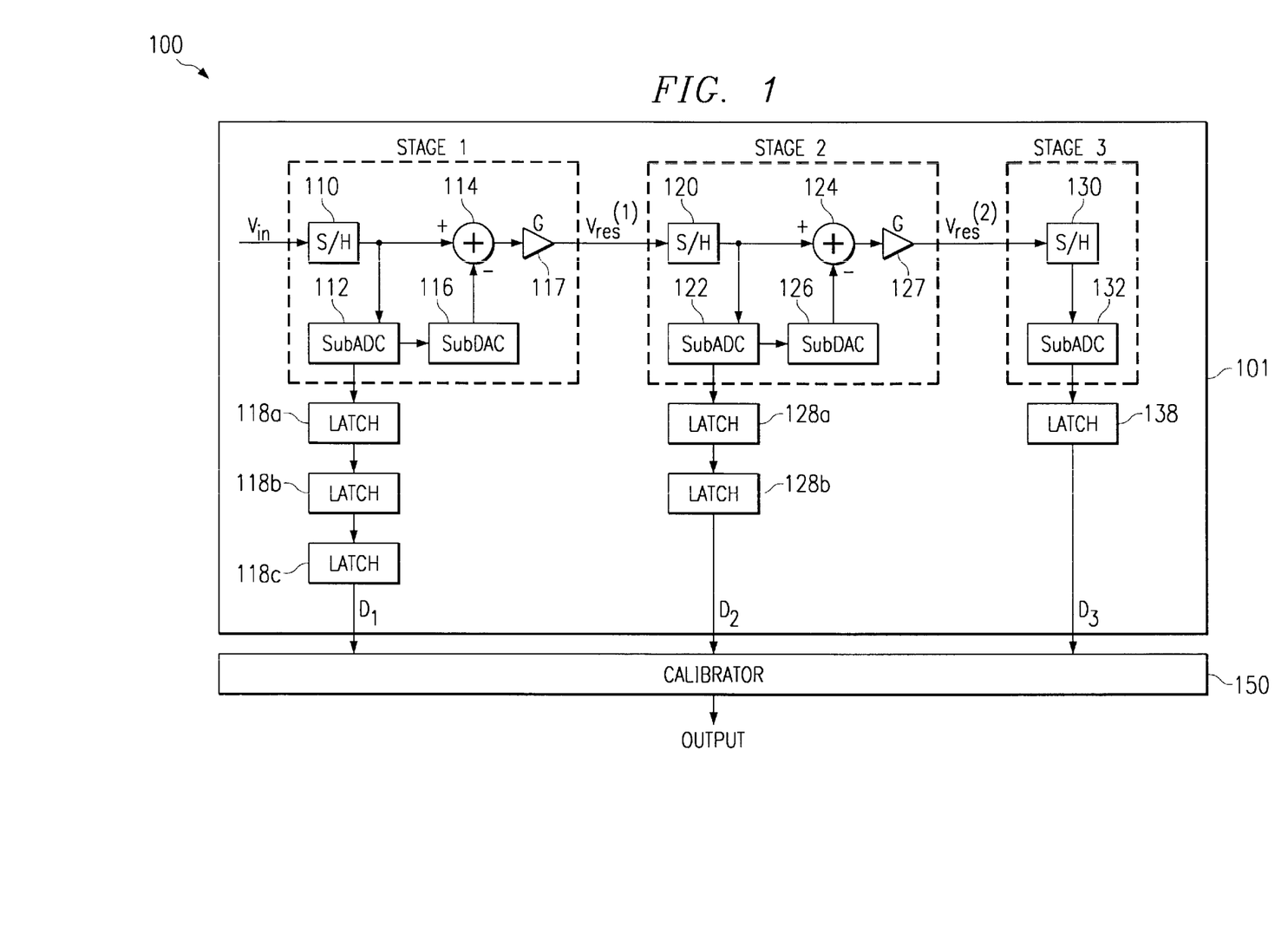
FIG. 1 is a block diagram of one embodiment of a system for calibrating data converters that may be used in accordance with the present invention.
Figure 2:
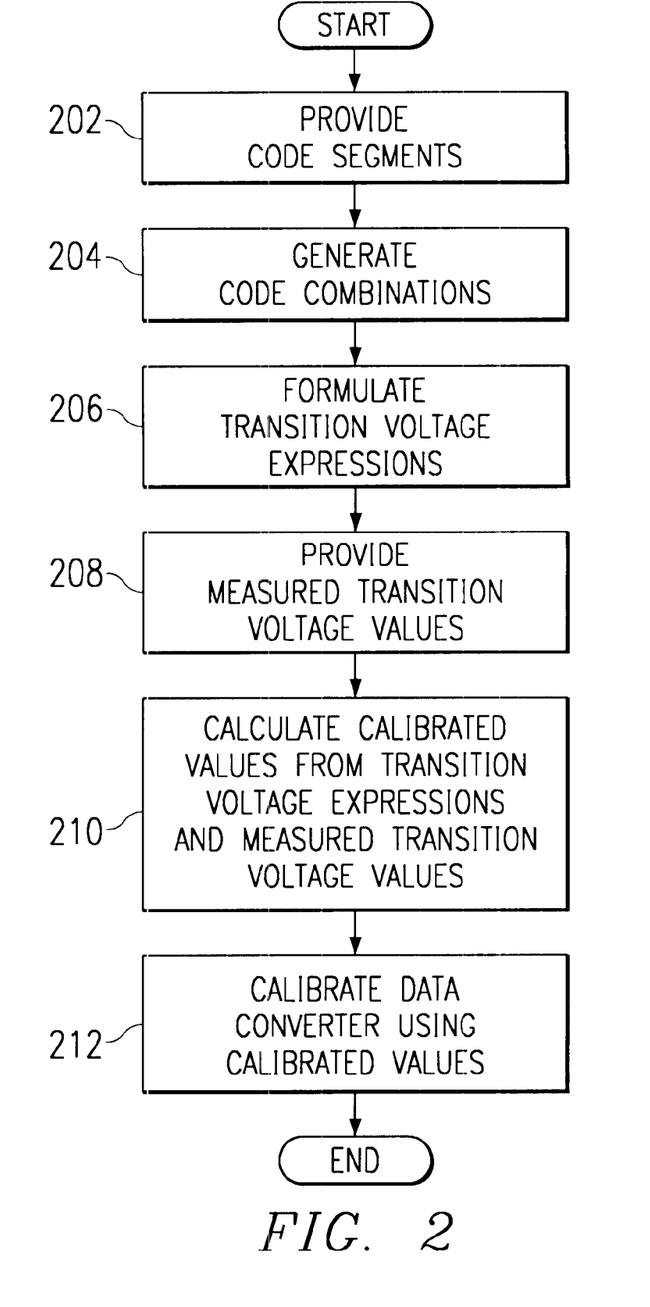
FIG. 2 is a flowchart demonstrating one embodiment of a method for calibrating data converters that may be used in accordance with the present invention.

A preferred embodiment of the present invention and its advantages are best understood by referring to FIGS. 1 and 2 of the drawings, like numerals being used for like and corresponding parts of the various drawings.

FIG. 1 is a block diagram of one embodiment of a system 100 for calibrating data converters that may be used in accordance with the present invention. In this embodiment, the system 100 is a three-stage pipelined analog-to-digital converter (ADC) 101 with an interstage gain G=2. Any suitable multi-stage data converter, however, may be used. The first and the second stages each comprise a sample and hold circuit (S/H) 110 and 120, a low resolution ADC (subADC) 112 and 122, a low resolution digital-to-analog converter (subDAC) 116 and 126, a subtractor 114 and 124, and an interstage amplifier 117 and 127, coupled as shown in FIG. 1. The third stage comprises a S/H 130 and a subADC 132. The subADC outputs before digital error correction are pre-digital error correction codes.

S/H 110 of the first stage samples and holds an analog input $V_i$. The input then moves to subADC 112 and to subtractor 114. SubADC 112 converts the input into a digital code segment $D_1$, which is a type of pre-digital error correction code, as a first approximation of the analog input. SubADC 112 may have, for example, two decision levels $v_{11}$ and $v_{12}$, where $v_{ij}$ is the jth decision level for the ith stage. Any number of decision levels, however, may be used. The two decision levels divide the input range, for example, [−1, 1] into three decision level sections, $s_{11}$=[−1, $v_{11}$]), $s_{12}$=[$v_{11}$, $v_{12}$), and $s_{13}$=[$v_{12}$, 1], where $s_{ik}$ is the kth decision level section for the ith stage. The three decision level sections, $s_{11}$, $s_{12}$, and $s_{13}$, correspond to three code segment values, for example, 00, 01, and 10, respectively. The input $V_i$ falls into one of the sections, for example, $V_i \in$[−1, $v_{11}$), and the subADC 112 outputs as the code segment $D_1$, where $D_1$ is code segment for the ith stage, the value corresponding to the section, for example, $D_1$=00. After conversion to a digital code, the subADC 112 output $D_1$ moves to latch 118a and then to a calibrator 150. The subADC 112 output $D_i$ also moves to subDAC 116, which converts $D_1$ back to an analog code. The three code segment values 00, 01, and 10 correspond to three analog subDAC outputs, $d_{11}$, $d_{12}$, and $d_{13}$, respectively, where $d_{ik}$ is the subDAC output corresponding to the kth decision level section of the ith stage. SubDAC 116 converts the digital code segment $D_1$, for example, $D_1$=00, to its corresponding subDAC output, for example, $d_{11}$. The subDAC output $d_{11}$ moves to subtractor 114. Subtractor 114 subtracts the subDAC output $d_{11}$, from the analog input $V_i$ to yield the residue $V_{res(1)}$. Amplifier 117 amplifies residue $V_{res(1)}$, and the residue is sent to the second stage.

At the second stage, S/H 120 samples and holds residue $V_{res(1)}$, and then the residue moves to subADC 122 and to subtractor 124. SubADC 122 converts the residue into a digital code segment $D_2$ as a second approximation of the analog input. As with subADC 112, subADC 122 may also have, for example, two decision levels $v_{21}$ and $v_{22}$, where $v_{ij}$ is the jth decision level for the ith stage, that divide the input range into three sections, $s_{21}$=[−1, $v_{21}$), $s_{22}$=[$v_{21}$, $v_{22}$), and $s_{23}$=[$v_{22}$, 1], where $s_{ik}$ is the kth section for the ith stage. The three sections, $s_{21}$, $s_{22}$, and $s_{23}$, correspond to three values, for example, 00, 01, and 10, respectively. The code segment $D_2$ moves to latch 128a and to subDAC 126, which converts the digital $D_2$ back to analog code $d_{ik}$. The subDAC may have three analog outputs, $d_{21}$, $d_{22}$, and $d_{23}$, where $d_{ik}$ is the subDAC output corresponding to the kth decision level section of the ith stage. The subDAC output $d_{ik}$ moves to subtractor 124. Subtractor 124 subtracts the subDAC output $d_{ik}$ from the residue $V_{res(1)}$, to yield the residue $V_{res(2)}$. Amplifier 127 amplifies residue $V_{res(2)}$, and the residue is sent to the third stage.

Note that when the first stage processes the current input analog signal $V_i$, the second stage processes the residue of previous sample $V_{i-1}$ from the first stage, and the third stage processes the residue of sample $V_{i-2}$ from second stage. That is, the sequential stages simultaneously work on the residue from successively sampled inputs. By adding the appropriate number of latches 118a-c, 128a-b, 138 at the output of each stage, the code segments $D_1$, $D_2$, and $D_3$ are synchronized, forming a pipelined architecture. For example, during the period when the second stage processes residue $V_{res(1)}$, digital code $D_1$ from the first stage moves from latch 118a to latch 118b.

At the third and final stage, S/H 130 samples and holds residue $V_{res(2)}$, and then the residue moves to subADC 132. SubADC 132 converts the residue into a code segment $D_3$ as a third approximation of the analog input, and the data moves to latch 138. During this period, code segment $D_1$ from the first stage moves to latch 118c, and code segment $D_2$ from the second stage moves to latch 128b, such that the code segments from the same analog input are available to enter the calibrator 150 at the same period.

Code segments $D_1$, $D_2$, and $D_3$ form a pre-digital error correction code $\{D_1, D_2, D_3\}$. The pre-digital error correction code $\{D_1, D_2, D_3\}$ may move to the calibrator 150, which formulates a transition voltage expression from the pre-digital error correction code and compares the transition voltage expression to a measured transition voltage value to generate calibrated values. The calibrated values may then be digitized and be used to obtain a corrected code. The ADC system 100 may use the corrected code as the final output of the ADC.

Table 1 summarizes the characteristics of the three stages:

TABLE 1

| sections | 1st stage | | | 2nd Stage | | | 3rd Stage | | |
| --- | --- | --- | --- | --- | --- | --- | --- | --- | --- |
| | [−1, $v_{11}$) | [$v_{11}$, $v_{12}$) | [$v_{12}$, 1] | [−1, $v_{21}$) | [$v_{21}$, $v_{22}$) | [$v_{22}$, 1] | [−1, $v_{31}$) | [$v_{31}$, $v_{32}$) | [$v_{32}$, 1] |
| subADC | 00 | 01 | 10 | 00 | 01 | 10 | 00 | 01 | 10 |
| subDAC | $d_{11}$ | $d_{12}$ | $d_{13}$ | $d_{21}$ | $d_{22}$ | $d_{23}$ | — | — | — |

Note that the third stage does not have any analog outputs, because it does not have a subDAC.

FIG. 2 is a flowchart demonstrating one embodiment of a method for calibrating data converters that may be used in accordance with the present invention. In general, in this embodiment, calibrated values are calculated from pre-digital error correction codes. The calculation of the calibrated values may be based on a data converter approximation of an analog input, given by the following Equation (1):

$$V_{in} = d_1 + \frac{d_2}{G_1} + \frac{d_3}{G_1 G_2} + \frac{d_4}{G_1 G_2 G_3} + \ldots + \frac{d_M}{G_1 G_2 G_3 \ldots G_{M-1}} + \varepsilon \quad (1)$$

where $d_i$ is the subDAC output corresponding to the ith stage, $G_1, G_2 \ldots G_{i-1}$ are the gain up to (i−1)th stage, and $\varepsilon$ is the final quantization error of the digital output. That is, the output is the sum of the subDAC outputs attenuated by the gain up to the previous stage, plus error. Due to circuit errors, the terms $d_i$ deviate from their ideal values.

In this embodiment, calibrated values are determined using transition voltages. A transition voltage for a code is the minimum analog voltage input that produces the code. The transition voltage may be expressed by a linear combination of $\vec{d}(n)$ and $\vec{v}(n)$, where $\vec{d}(n)$ is the set of subDAC output voltages $d_{ik}$, $d_{ik}$ is the subDAC output corresponding to the kth decision level section of the ith stage, and where $\vec{v}(n)$ is the set of all subADC threshold voltages $v_{ij}$, $v_{ij}$ is the jth decision level for the ith stage. The expressions of the transition voltages in terms of the output and threshold voltages may be compared to measured transition voltages. The calibrated values are the best fit values of the output and threshold voltages determined by comparing the transition voltage expressions with the measured transition voltages.

Specifically, the method begins with step 202, where the pre-digital error correction codes of an input signal are provided. In this embodiment, the three subADCs 112, 122, and 132 of system 100 each provide code segments 00, 01, and 10, as shown in TABLE 1. In step 204, all the permutations of the code segments are generated to determine all the possible code segment permutations. The three code segments generate twenty-seven code segment permutations, where n is the index of the permutation as shown in TABLE 2.

TABLE 2

| Code n | $D_1$ | $D_2$ | $D_3$ |
| --- | --- | --- | --- |
| code 1 | 00 | 00 | 00 |
| code 2 | 00 | 00 | 01 |
| code 3 | 00 | 00 | 10 |
| code 4 | 00 | 01 | 00 |
| code 5 | 00 | 01 | 01 |
| code 6 | 00 | 01 | 10 |
| code 7 | 00 | 10 | 00 |
| code 8 | 00 | 10 | 01 |
| code 9 | 00 | 10 | 10 |
| code 10 | 01 | 00 | 00 |
| code 11 | 01 | 00 | 01 |
| code 12 | 01 | 00 | 10 |
| code 13 | 01 | 01 | 00 |
| code 14 | 01 | 01 | 01 |
| code 15 | 01 | 01 | 10 |
| code 16 | 01 | 10 | 00 |
| code 17 | 01 | 10 | 01 |
| code 18 | 01 | 10 | 10 |
| code 19 | 10 | 00 | 00 |
| code 20 | 10 | 00 | 01 |
| code 21 | 10 | 00 | 10 |
| code 22 | 10 | 01 | 00 |
| code 23 | 10 | 01 | 01 |
| code 24 | 10 | 01 | 10 |
| code 25 | 10 | 10 | 00 |
| code 26 | 10 | 10 | 01 |
| code 27 | 10 | 10 | 10 |

Note that in reality, only a subset of the permutations occurs.

In step 206, the transition voltage expressions are formulated. The transition voltage $V_{Tn}$ is the voltage that transforms code n−1 ($D_{(n-1)1}$, $D_{(n-1)2}$, $D_{(n-1)3}$) to code n ($D_{n1}$, $D_{n2}$, $D_{n3}$), where $D_{ni}$ is the code segment from the ith stage of code n. In general, to calculate the transition voltage, the code segments $D_{(n-1)i}$ that are not equal to $D_{ni}$ are determined, and then the $D_{ni}$ from the earliest stage, the stage with the smallest i value, is selected. The transition voltage is the input $V_{in}$ that makes the stage (i−1) residue equal to the stage i decision level corresponding to $D_{ni}$. For example, transition voltage $V_{T1}$ transforms code 1 (00, 00, 00) to code 2 (00, 00, 01). Since code segment $D_{23}$=01 is the only segment that has changed, it is selected. The changed segment $D_{23}$ occurs at the third stage, so the second stage residue $V_{res(2)}$, which is the input to the third stage, causes the change. Moreover, according to TABLE 1, the voltage that corresponds to segment value 01 at the third stage is $V_{31}$. Thus, the second stage residue $V_{res(2)}$ equals the third stage decision level $v_{31}$, which is expressed by Equation (2):

$$V_{res(2)} = v_{31} \quad (2)$$

The transition voltage is defined in terms of the input voltage, so to determine the input voltage, a general relationship between residues of successive stages, described by Equation (3), is used:

$$V_{res(i)} = G[V_{res(i-1)} - d_{ik}] \quad (3)$$

where G is the gain of the amplifier and $d_{ik}$ is the subDAC output corresponding to the kth decision level section of the ith stage subDAC. Assume in this example that G=2. Equa tion (3) may be used to yield the relationship expressed by Equation (4):

$$V_{res(2)}=2[V_{res(1)}-d_{2k}]=2[V_{res(1)}-d_{21}] \quad (4)$$

In Equation (4), $d_{2k}=d_{21}$ because $D_{22}=00$, which corresponds to $d_{21}$, as shown in TABLE 1. Equation (3) also yields the relationship expressed by Equation (5):

$$V_{res(1)}=2[V_{in}-d_{1k}]=2[V_{in}-d_{11}] \quad (5)$$

In Equation (5), $d_{1k}=d_{11}$ because $D_{21}=00$, which corresponds to $d_{11}$, as shown in TABLE 1. Solving for $V_{in}$ by substituting Equation (5) into Equation (4) and Equation (4) into Equation (3) yields the transition voltage $V_{T2}$, which is expressed by Equation (6):

$$2[2(V_{in}-d_{11})-d_{21}]=v_{31}$$

$$\therefore V_{T2} = V_{in} = d_{11} + \frac{1}{2}d_{21} + \frac{1}{4}v_{31} \quad (6)$$

Similarly, $V_{T4}$ is the transition voltage of code 3 (00, 00, 10), to code 4 (00, 01, 00). Both $D_{42}$ and $D_{43}$ have changed, but only $D_{42}$ is selected since $D_{42}$ is earlier than $D_{43}$. The changed segment $D_{42}$ occurs at the second stage, so the first stage residue $V_{res(1)}$, which is the input to the second stage, causes the change. Moreover, according to TABLE 1, the voltage that corresponds to segment value 01 at the third stage is $v_{21}$. Thus, the first stage residue equals the second stage decision level $v_{21}$. Again, using Equation (3) and solving for $V_{in}$, the expression for transition voltage $V_{T4}$ can be formulated, as shown by Equation (7):

$$V_{res(1)}=v_{21}$$

$$V_{res(1)}=2(V_{in}-d_{1k})=2(V_{in}-d_{11})$$

$$V_{T4} = V_{in} = d_{11} + \frac{1}{2}v_{21} \quad (7)$$

In Equation (7), $d_{1k}=d_{11}$ because $D_{21}=00$, which corresponds to $d_{11}$, as shown in TABLE 1.

Similarly, $V_{T10}$ is the transition voltage of code 9 (00, 10, 10) to code 10 (10, 01, 00). Segments $D_{101}$, $D_{102}$ and $D_{103}$ have changed, but only $D_{101}$ is selected since it changed first. The changed segment $D_{101}$ occurs at the first stage, so the input voltage $V_{in}$, which is the input to the first stage, causes the change. Moreover, according to TABLE 1, the voltage that corresponds to segment value 01 at the third stage is $v_{11}$. Thus, the input voltage $V_{in}$, and consequently the transition voltage $V_{T10}$, equals the first stage decision level $v_{11}$, as expressed by Equation (8).

$$V_{T10}=V_{in}=v_{11} \quad (8)$$

The remainder of the transition voltage expressions for voltages $V_{Ti}$ may be formulated in a similar manner, as shown in TABLE 3:

TABLE 3

| Code n | $D_1$ | $D_2$ | $D_3$ | |
|---|---|---|---|---|
| code 1 | 00 | 00 | 00 | |
| code 2 | 00 | 00 | 01 | $V_{T2} = d_{11} + \frac{1}{2}d_{21} + \frac{1}{4}v_{31}$ |
| code 3 | 00 | 00 | 10 | $V_{T3} = d_{11} + \frac{1}{2}d_{21} + \frac{1}{4}v_{32}$ |
| code 4 | 00 | 01 | 00 | $V_{T4} = d_{11} + \frac{1}{2}v_{21}$ |
| code 5 | 00 | 01 | 01 | $V_{T5} = d_{11} + \frac{1}{2}d_{22} + \frac{1}{4}v_{31}$ |
| code 6 | 00 | 01 | 10 | $v_{T7} = d_{11} + \frac{1}{2}d_{22} + \frac{1}{4}v_{32}$ |
| code 7 | 00 | 10 | 00 | $V_{T7} = d_{11} + \frac{1}{2}v_{22}$ |
| code 8 | 00 | 10 | 01 | $V_{T8} = d_{11} + \frac{1}{2}d_{23} + \frac{1}{4}v_{31}$ |
| code 9 | 00 | 10 | 10 | $V_{T9} = d_{11} + \frac{1}{2}d_{23} + \frac{1}{4}v_{32}$ |
| code 10 | 01 | 00 | 00 | $C_{T10} = v_{11}$ |
| code 11 | 01 | 00 | 01 | $v_{T11} = d_{12} + \frac{1}{2}d_{21} + \frac{1}{4}v_{31}$ |
| code 12 | 01 | 00 | 10 | $V_{T12} = d_{12} + \frac{1}{2}d_{21} + \frac{1}{4}v_{32}$ |
| code 13 | 01 | 01 | 00 | $V_{T13} = d_{12} + \frac{1}{2}v_{21}$ |
| code 14 | 01 | 01 | 01 | $V_{T14} = d_{12} + \frac{1}{2}d_{22} + \frac{1}{4}v_{31}$ |
| code 15 | 01 | 01 | 10 | $V_{T15} = d_{12} + \frac{1}{2}d_{22} + \frac{1}{4}v_{32}$ |
| code 16 | 01 | 10 | 00 | $v_{T16} = d_{12} + \frac{1}{2}v_{22}$ |
| code 17 | 01 | 10 | 01 | $V_{T17} = d_{12} + \frac{1}{2}d_{23} + \frac{1}{4}v_{31}$ |
| code 18 | 01 | 10 | 10 | $V_{T18} = d_{12} + \frac{1}{2}d_{23} + \frac{1}{4}v_{32}$ |
| code 19 | 10 | 00 | 00 | $V_{T19} = v_{22}$ |
| code 20 | 10 | 00 | 01 | $V_{T20} = d_{13} + \frac{1}{2}d_{21} + \frac{1}{4}v_{31}$ |
| code 21 | 10 | 00 | 10 | $V_{T21} = d_{13} + \frac{1}{2}d_{21} + \frac{1}{4}v_{32}$ |
| code 22 | 10 | 01 | 00 | $v_{T22} = d_{13} + \frac{1}{2}v_{21}$ |
| code 23 | 10 | 01 | 01 | $V_{T23} = d_{13} + \frac{1}{2}d_{22} + \frac{1}{4}v_{31}$ |
| code 24 | 10 | 01 | 10 | $V_{T24} = d_{13} + \frac{1}{2}d_{22} + \frac{1}{4}v_{32}$ |

TABLE 3-continued

| Code n | D$_1$ | D$_2$ | D$_3$ | |
|---|---|---|---|---|
| code 25 | 10 | 10 | 00 | $V_{T25} = d_{13} + \frac{1}{2}v_{22}$ |
| code 26 | 10 | 10 | 01 | $V_{T26} = d_{13} + \frac{1}{2}d_{23} + \frac{1}{4}v_{31}$ |
| code 27 | 10 | 10 | 10 | $V_{T27} = d_{13} + \frac{1}{2}d_{23} + \frac{1}{4}v_{32}$ |

In step 208, measured transition voltage values are provided. These values may be provided by, for example, measurements made during factory testing.

In step 210, the transition voltage expressions are compared to the measured voltages in order to calculate the calibrated values. The transition voltage expressions and the measured transition voltages may be compared using, for example, a least square fit analysis. In general, the analysis may be performed using Equation (9):

$$X^2 = \sum_{n=1}^{N} w_n \{V_{Tmn} - V_T[\vec{d}(n), \vec{v}(n)]\}^2 \quad (9)$$

where:

$X^2$=is the objective function;

N=total number of pre-digital error correction codes;

n=code index;

$V_{Tmn}$=measured transition voltage;

$w_n$=1 if transition voltage $V_{Tmn}$ is observed; 0 otherwise;

$V_T(\vec{d}(n), \vec{v}(n)) = V_T$ in terms of a linear combination of $\vec{d}(n)$ and $\vec{v}(n)$;

$\vec{d}(n)$=the set of subDAC output voltages $d_{ik}$, where $d_{ik}$ is the subDAC output corresponding to the kth decision level section of the ith stage; and $\vec{v}(n)$=the set of subADC threshold voltages $v_{ij}$, where $v_{ij}$ is the jth decision level for the ith stage.

Minimizing $X^2$ by setting $$\frac{\partial X^2}{\partial P} = 0,$$

where P represents each of the $\vec{d}(n)$ and $\vec{v}(n)$ combinations, yields:

$$\frac{\partial X^2}{\partial P} = -2 \sum_{T=1}^{N} w_n[V_{Tmn} - V_T(\vec{d}(n), \vec{v}(n))]\left(\frac{dV_T(\vec{d}(n), \vec{v}(n))}{dP}\right)$$

$$\frac{dV_T(\vec{d}(n), \vec{v}(n))}{d(d_{kj})} = \begin{matrix} 1 \text{ if } d_{kj} \text{ contributes to } V_T(n) \\ 0 \text{ otherwise} \end{matrix}$$

$$\frac{dV_T(\vec{d}(n), \vec{v}(n))}{d(v_{lm})} = \begin{matrix} 1 \text{ if } v_{lm} \text{ contributes to } V_T(n) \\ 0 \text{ otherwise} \end{matrix}$$

Rearranging the equations yields:

$$\frac{\partial X^2}{\partial d_{kj}} = \sum_{i \in S_{d_{kj}}} w_n[V_{Tmn} - V_T(\vec{d}(n), \vec{v}(n))] = 0$$

$$\frac{\partial X^2}{\partial d_{lm}} = \sum_{i \in S_{d_{lm}}} w_n[V_{Tmn} - V_T(\vec{d}(n), \vec{v}(n))] = 0$$

where $S_{d_{kj}}$=the set of all codes where subDAC parameter $d_{kj}$ is a term in the expression of the corresponding transition voltage; and $S_{v_{lm}}$=the set of all codes where subDAC parameter $v_{lm}$ is a term in the expression of the corresponding transition voltage.

The final relations are expressed by Equations (10):

$$\sum_{n \in S_{d_{kj}}} w_n V(\vec{d}(n), \vec{v}(n)) = \sum_{n \in S_{d_{kj}}} w_n V_{Tmn} \quad (10)$$

$$\sum_{n \in S_{v_{lm}}} w_n V(\vec{d}(n), \vec{v}(n)) = \sum_{n \in S_{v_{lm}}} w_n V_{Tmn}$$

If the total number of subDAC parameters $d_{ik}$ is M and the total number of subADC parameters $v_{ij}$ is N, then the final form of the matrix described by Equations (10) is AX=B, where A is (M+N)×(M+N) square matrix, X is an unknown vector of (M+N) elements, and B is a constant vector of (M+N) elements.

As mentioned earlier, all 27 pre-digital error correction codes may not occur. For example, in this specific case where there are no errors in the ADC, only 23 pre-digital error correction codes occur, as shown in TABLE 4.

TABLE 4

| Code n | Measured V$_T$ |
|---|---|
| code 1 | |
| code 2 | $V_{T2} = -0.8125$ |
| code 3 | $V_{T3} = -0.6875$ |
| code 4 | $V_{T4} = -0.625$ |
| code 5 | $V_{T5} = -0.5625$ |
| code 6 | $V_{T6} = -0.4375$ |
| code 7 | $V_{T7} = -0.375$ |
| code 8 | $V_{T8} = -0.3125$ |
| code 11 | $V_{T11} = -0.25$ |
| code 12 | $V_{T12} = -0.1875$ |
| code 13 | $V_{T13} = -0.125$ |
| code 14 | $V_{T14} = -0.0625$ |
| code 15 | $V_{T15} = 0.0625$ |
| code 16 | $V_{T16} = 0.125$ |
| code 17 | $V_{T17} = 0.1875$ |
| code 18 | $V_{T18} = 0.25$ |
| code 21 | $V_{T21} = 0.3125$ |
| code 22 | $V_{T22} = 0.375$ |
| code 23 | $V_{T23} = 0.4375$ |
| code 24 | $V_{T24} = 0.5625$ |
| code 25 | $V_{T25} = 0.625$ |
| code 26 | $V_{T26} = 0.6875$ |
| code 27 | $V_{T27} = 0.8125$ |

To perform the least square fit analysis, the expressions for the transition voltages and the values of the measured voltages are substituted into Equation (10). The substitution yields:

$$\begin{bmatrix} 7 & 0 & 0 & 2 & 2 & 1 & 0 & 0 & 1 & 1 & 3 & 2 \\ 0 & 6 & 0 & 1 & 2 & 1 & 0 & 0 & 1 & 1 & 2 & 2 \\ 0 & 0 & 7 & 1 & 2 & 2 & 0 & 0 & 1 & 1 & 2 & 3 \\ 2 & 1 & 1 & 4 & 0 & 0 & 0 & 0 & 0 & 0 & 1 & 3 \\ 2 & 2 & 2 & 0 & 6 & 0 & 0 & 0 & 0 & 0 & 3 & 3 \\ 1 & 1 & 2 & 0 & 0 & 4 & 0 & 0 & 0 & 0 & 3 & 1 \\ 0 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 \\ 1 & 1 & 1 & 0 & 0 & 0 & 0 & 0 & 3 & 0 & 0 & 0 \\ 1 & 1 & 1 & 0 & 0 & 0 & 0 & 0 & 0 & 3 & 0 & 0 \\ 3 & 2 & 2 & 1 & 3 & 3 & 0 & 0 & 0 & 0 & 7 & 0 \\ 2 & 2 & 3 & 3 & 3 & 1 & 0 & 0 & 0 & 0 & 0 & 7 \end{bmatrix} \begin{bmatrix} d_{11} \\ d_{12} \\ d_{13} \\ \frac{1}{2}d_{21} \\ \frac{1}{2}d_{22} \\ \frac{1}{2}d_{23} \\ v_{11} \\ v_{12} \\ \frac{1}{2}v_{21} \\ \frac{1}{2}v_{22} \\ \frac{1}{4}v_{31} \\ \frac{1}{4}v_{32} \end{bmatrix} = \begin{bmatrix} -3.8125 \\ 0 \\ 3.8125 \\ -1.375 \\ 0 \\ 1.375 \\ -0.25 \\ 0.25 \\ -0.375 \\ 0.375 \\ -0.4375 \\ 0.4375 \end{bmatrix}$$

The solution to Equation (10) is:
$d_{11} = -0.5$
$d_{12} = 0$,
$d_{13} = 0.5$
$\frac{1}{2}d_{21} = -0.25$
$\frac{1}{2}d_{22} = 0$
$\frac{1}{2}d_{23} = 0.25$
$v_{11} = -0.25$
$v_{12} = 0.25$
$\frac{1}{2}v_{21} = -0.125$
$\frac{1}{2}v_{22} = 0.125$
$\frac{1}{4}v_{31} = -0.0625$
$\frac{1}{4}v_{32} = 0.0625$ In step 212, the data converter 101 is calibrated using the calibrated values. The d values, $d_{11}$, $d_{12}$, $d_{13}$, $\frac{1}{2}d_{21}$, $\frac{1}{2}d_{22}$, $\frac{1}{2}d_{23}$, are used as calibrated values to calibrate the data converter 101. The values may be, for example, digitized to form corrected codes. The calibrated values may calibrate the data converter in other ways, for example, the values may be used to compute optimal subDAC parameters for use in capacitor trimming.

A technical advantage of the present invention is that it uses pre-digital error correction codes, which directly reflects the behavior of every ADC stage, and therefore contains more error information. Consequently, the use of pre-digital error correction codes increases the accuracy of the error correction, thus improving the performance of calibrated ADCs. Another technical advantage of the present invention is that it determines the best fit for the full range of input voltages, resulting in a better approximation over the whole range, which is especially important for applications that require a large dynamic range. Another technical advantage of the present invention is that it poses no additional requirement on ADC design. The only requirement is that pre-digital error correction codes must be accessible during the calibration mode. Other technical advantages are readily apparent to one of skill in the art.

Although an embodiment of the invention and its advantages are described in detail, a person skilled in the art could make various alternations, additions, and omissions without departing from the spirit and scope of the present invention as defined by the appended claims.

What is claimed is:

1. A system for calibrating a data converter, the system comprising:

a data converter operable to receive an input signal and to generate one or more pre-digital error correction from the input signal; and a calibrator operable to:
 receive the pre-digital error correction codes;
 formulate one or more transition voltage expressions using the pre-digital error correction codes; and
 compare the transition voltage expressions to one or more measured transition voltage values to generate one or more calibrated values, wherein:

the pre-digital error correction codes comprise at least two code segments; and the calibrator formulates one of the transition voltage expressions by:
 generating a first permutation and a second permutation from the code segments; and
 formulating the transition voltage expression for the transition from the first permutation to the second permutation.

2. The system of claim 1 wherein the data converter is a pipelined converter.

3. The system of claim 1 wherein the data converter comprises an analog-to-digital converter operable to receive the input signal and to convert the input signal to a digital code.

4. The system of claim 1 wherein:

a. the data converter comprises an analog-to-digital converter operable to receive the input signal and to convert the input signal into one or more digital codes;

b. The pre-digital error correction codes comprise the digital codes; and c. the calibrator formulates the transition voltage expressions using the digital codes.

5. The system of claim 1 wherein:

a. the data converter comprises:

b. an analog-to-digital converter operable to receive the input signal and to convert the input signal into one or more digital codes; and c. a digital-to-analog converter operable to convert the digital codes to one or more analog codes; and d. the pre-digital error correction codes comprise the analog codes; and e. the calibrator formulates the transition voltage expressions using the analog codes.

6. The system of claim 1, wherein:

the data converter comprises a digital-to-analog converter operable to receive a signal and to convert the signal into one-error correction codes; and the calibrator is operable to receive the pre-error correction codes.

7. The system of claim 1 wherein the data converter comprises two or more analog-to-digital converters operable to receive the input signal and to convert the input signal to a digital code.

8. The system of claim 1 wherein the calibrator computes the calibrated values by performing a least square fit operation between the transition voltage expressions and the measured transition voltage values to determine the calibrated values.

9. A system for calibrating a data converter, the system comprising:

a data converter operable to receive an input signal and to generate one or more pre-digital error correction codes from the input signal; and a calibrator operable to:
- receive the pre-digital error correction codes;
- formulate one or more transition voltage expressions using the pre-digital error correction codes; and
- compare the transition voltage expressions to one or more measured transition voltage values to generate one or more calibrated values, wherein :

the pre-digital error correction code comprises at least two code segments; and the calibrator formulates one of the transition voltage expressions by:
- generating a first permutation and a second permutation from the code segments, wherein the first and the second permutations each comprise an earlier and a later code segment; and
- formulating the transition voltage expression for the transition from the first permutation to the second permutation by;
  - formulating a voltage expression for the transition from the earlier code segment of the first permutation to the earlier code segment of the second permutation if the earlier code segment of the first permutation differs from the earlier code segment of the second permutation; and
  - formulating a voltage expression for the transition from the later code segment of the first permutation to the later code segment of the second permutation if the earlier code segment of the first permutation is equivalent to the earlier code segment of the second permutation.

10. A method for calibrating a data converter, the method comprising:
- inputting an input signal into a data converter;
- providing one or more pre-digital error correction codes for the input signal;
- measuring one or more transition voltages to yield one or more measured transition voltage values;
- formulating one or more transition voltage expressions from the pre-digital error correction codes;
- calculating one or more calibrated values by comparing the transition voltage expressions to the measured transition voltage values; and
- calibrating the data converter using the calibrated values, wherein:

the pre-digital error correction code comprises at least two code segments; and the step of formulating comprises:
- generating a first permutation and a second permutation from the code segments, wherein the first and the second permutations each comprise an earlier and a later code segments; and
- formulating the transition voltage expression for the transition from the first permutation to the second permutation by:
  - formulating a voltage expression for the transition from the earlier code segment of the first permutation to the earlier code segment of the second permutation if the earlier code segment of the first permutation differs from the earlier code segment of the second permutation; and
  - formulating a voltage expression for the transition from the later code segment of the first permutation to the later code segment of the second permutation if the earlier code segment of the first permutation is equivalent to the earlier code segment of the second permutation.

11. A method for calibrating a data converter, the method comprising:
- inputting an input signal into a data converter;
- providing one or more pre-digital error correction codes for the input signal, wherein the pre-digital error correction code comprises at least two code segments;

- measuring one or more transition voltage values to yield one or more measured transition voltage values;
- formulating one or more transition voltage expressions from the pre-digital error correction codes by:
  - generating a first permutation and a second permutation from the code segments, wherein the first and the second permutations each comprise an earlier and a later code segment; and
  - formulating the transition voltage expression for the transition from the first permutation to the second permutation by:
    - formulating a voltage expression for the transition from the earlier code segment of the first permutation to the earlier code segment of the second permutation if the earlier code segment of the first permutation differs from the earlier code segment of the second permutation; and
    - formulating a voltage expression for the transition from the later code segment of the first permutation to the later code segment of the second permutation if the earlier code segment of the first permutation is equivalent to the earlier code segment of the second permutation;
- calculating one or more calibrated values by performing a least square fit operation between the transition voltage expressions and the measured transition voltage values to determine the calibrated values; and
- calibrating the data converter using the calibrated values.

12. A method for calibrating a data converter, the method comprising:
- inputting an input signal into a data converter;
- providing one or more pre-digital error correction codes for the input signal;
- measuring one or more transition voltages to yield one or more measured transition voltage values;
- formulating one or more transition voltage expressions from the pre-digital error correction codes;
- calculating one or more calibrated values by comparing the transition voltage expressions to the measured transition voltage values; and
- calibrating the data converter using the calibrated values, wherein:

the pre-digital error correction codes comprise at least two code segments; and the step of formulating comprises:
- generating a first permutation and a second permutation from the code segments; and
- formulating the transition voltage expression for the transition from the first permutation to the second permutation.

13. The method of claim 12 wherein the data converter comprises an analog-to-digital converter operable to receive the input signal and to convert the input signal to a digital code.

14. The method of claim 12 wherein:

the data converter comprises an analog-to-digital converter operable to receive the input signal and to convert the input signal into one or more digital codes;

the pre-digital error correction codes comprise the digital codes; and the step of formulating comprises formulating the transition voltage expressions using the digital codes.

15. The method of claim 12 wherein:

the data converter comprises:

an analog-to-digital converter operable to receive the input signal and to convert the input signal into one or more digital codes; and a digital-to-analog converter operable to convert the digital codes to one or more analog codes;

the pre-digital error correction codes comprise the analog codes; and the step of formulating comprises formulating the transition voltage expressions using the analog codes.

16. The method of claim 12 wherein the step of comparing comprises performing a least square fit operation using the transition voltage expressions and the measured transition voltage values to determine the calibrated values.

17. The method of claim 12 further comprising correcting errors caused by an analog-to-digital converter operable to receive the input signal and to convert the input signal into a digital code.

18. The method of claim 12 wherein the data converter is a pipelined analog-to-digital converter.

* * * * *